(12) United States Patent
Ebisuno et al.

(10) Patent No.: US 10,074,710 B2
(45) Date of Patent: Sep. 11, 2018

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Kohei Ebisuno, Asan-si (KR); Ae Shin, Seoul (KR); Yong Ho Yang, Suwon-si (KR); Jun Hee Lee, Cheonan-si (KR); Nak Cho Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/490,661

(22) Filed: Apr. 18, 2017

(65) Prior Publication Data
US 2018/0069069 A1    Mar. 8, 2018

(30) Foreign Application Priority Data
Sep. 2, 2016  (KR) .......................... 10-2016-0113311

(51) Int. Cl.
*H01L 27/32* (2006.01)

(52) U.S. Cl.
CPC ...... *H01L 27/3272* (2013.01); *H01L 27/3216* (2013.01); *H01L 27/3246* (2013.01); *H01L 27/3265* (2013.01); *H01L 27/3276* (2013.01)

(58) Field of Classification Search
CPC . H01L 27/32; H01L 27/3272; H01L 27/3216; H01L 27/3246; H01L 27/3265
See application file for complete search history.

(56) References Cited

U.S. PATENT DOCUMENTS

| 9,324,740 | B2 | 4/2016 | Lee et al. | |
| 2004/0252263 | A1* | 12/2004 | Yang | G02F 1/133555 349/114 |
| 2011/0215329 | A1* | 9/2011 | Chung | H01L 51/52 257/59 |
| 2016/0254337 | A1* | 9/2016 | Choi | H01L 27/3272 257/40 |

FOREIGN PATENT DOCUMENTS

| KR | 10-2014-0079093 | 6/2014 |
| KR | 10-2016-0068635 | 6/2016 |

* cited by examiner

*Primary Examiner* — Phuc Dang
(74) *Attorney, Agent, or Firm* — F. Chau & Associates, LLC

(57) ABSTRACT

An organic light emitting diode display includes a substrate, a plurality of pixels disposed on the substrate, and a plurality of transmitting windows configured to transmit light therethrough. The plurality of transmitting windows is spaced apart from the plurality of pixels. Each of the plurality of pixels includes a transistor and a capacitor. The transistor includes a light-blocking electrode disposed on the substrate and a plurality of electrode members disposed at different layers on the light-blocking electrode. The capacitor includes a first capacitor electrode disposed on a same layer as the light-blocking electrode, and a second capacitor electrode disposed on a same layer as a first one of the plurality of electrode members to overlap the first capacitor electrode.

23 Claims, 15 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2016-0113311, filed in the Korean Intellectual Property Office on Sep. 2, 2016, the entire contents of which are herein incorporated by reference.

TECHNICAL FIELD

The present disclosure relates to a display device, and more specifically, to an organic light emitting diode display.

DISCUSSION OF THE RELATED ART

An organic light emitting diode (OLED) display device includes two electrodes (a cathode and an anode) and an organic light emitting layer disposed therebetween. Electrons injected from the cathode and holes injected from the anode are bonded to each other within the organic light emitting layer to form excitons. Light is emitted as the excitons relax and discharge energy.

The organic light emitting diode display includes a plurality of pixels, each including an organic light emitting diode having a cathode, an anode, and an organic emission layer. A plurality of transistors and at least one capacitor are formed in each of the pixels to drive the organic light emitting diode. The transistors each include a switching transistor and a driving transistor.

SUMMARY

An organic light emitting diode display includes a substrate, a plurality of pixels disposed on the substrate, and a plurality of transmitting windows configured to transmit light therethrough. The plurality of transmitting windows is spaced apart from the plurality of pixels. Each of the plurality of pixels includes a transistor and a capacitor. The transistor includes a light-blocking electrode disposed on the substrate and a plurality of electrode members disposed at different layers on the light-blocking electrode. The capacitor includes a first capacitor electrode disposed on a same layer as the light-blocking electrode, and a second capacitor electrode disposed on a same layer as a first one of the plurality of electrode members to overlap the first capacitor electrode.

A display device includes a substrate, a plurality of windows, and a thin film transistor. The substrate has a pixel area on which a plurality of pixels is disposed and a light transmitting area on which light is permitted to pass therethrough. The plurality of windows is disposed within the light transmitting area of the substrate. The thin film transistor is disposed within each of the plurality of pixels. The thin film transistor includes a light-blocking electrode disposed on the substrate and a plurality of electrode members disposed at different layers on the light-blocking electrode. A capacitor includes a first capacitor electrode disposed on a same layer as the light-blocking electrode, and a second capacitor electrode disposed on a same layer as a first one of the plurality of electrode members to overlap the first capacitor electrode.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
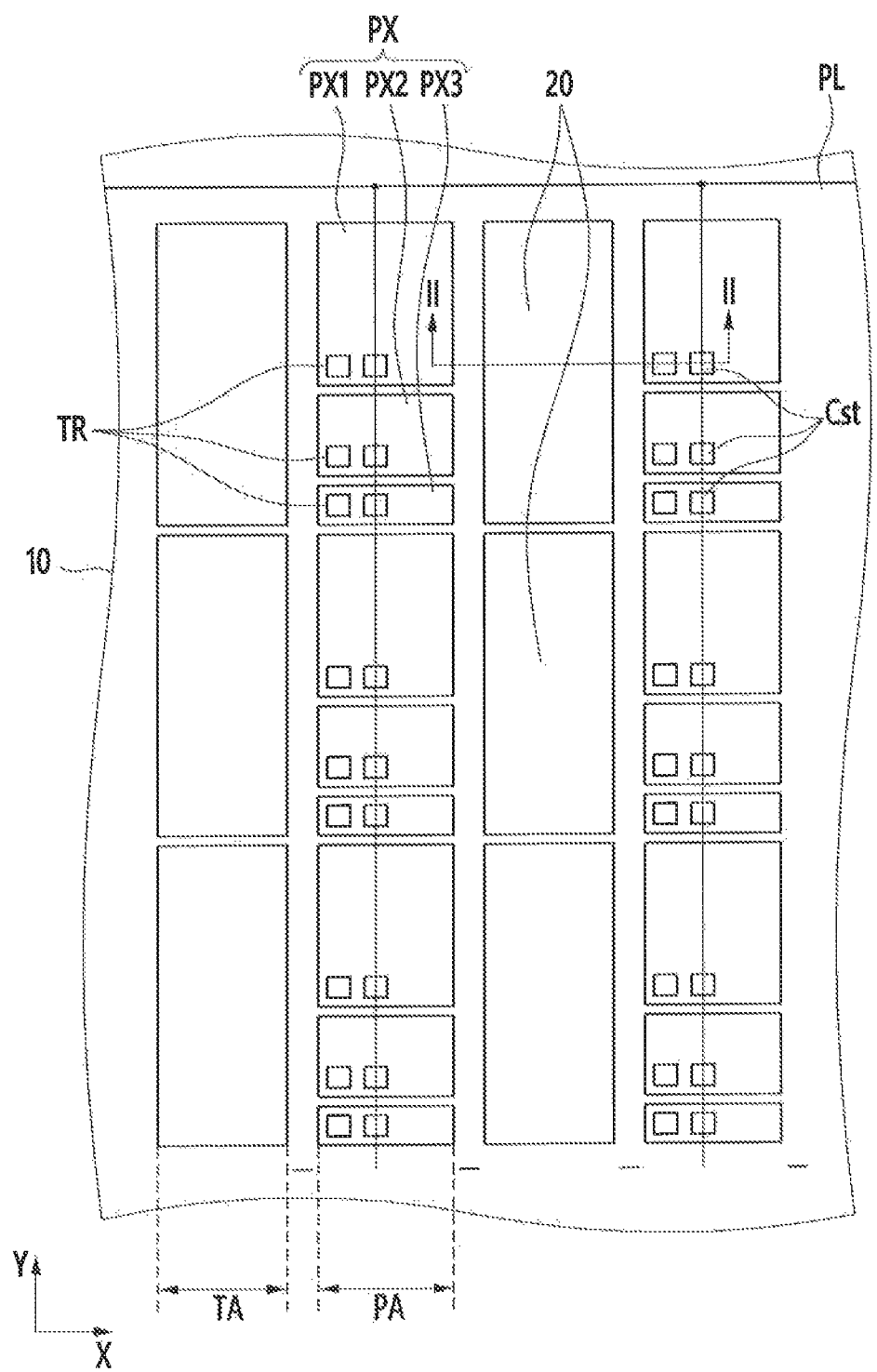
FIG. 1 is a schematic layout view illustrating an organic light emitting diode display according to an exemplary embodiment of the present disclosure.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like numerals may refer to like or similar constituent elements throughout the specification and drawings.

In the drawings, the thickness of layers, films, panels, areas, regions, etc., may be exaggerated for clarity.

It will be understood that when an element such as a layer, film, region, or substrate is referred to as being "on" another element, it can be directly on the other element or intervening elements may also be present.

An organic light emitting diode display according to an exemplary embodiment of the present disclosure will now be described in detail with reference to the accompanying drawings.

Figure 2:
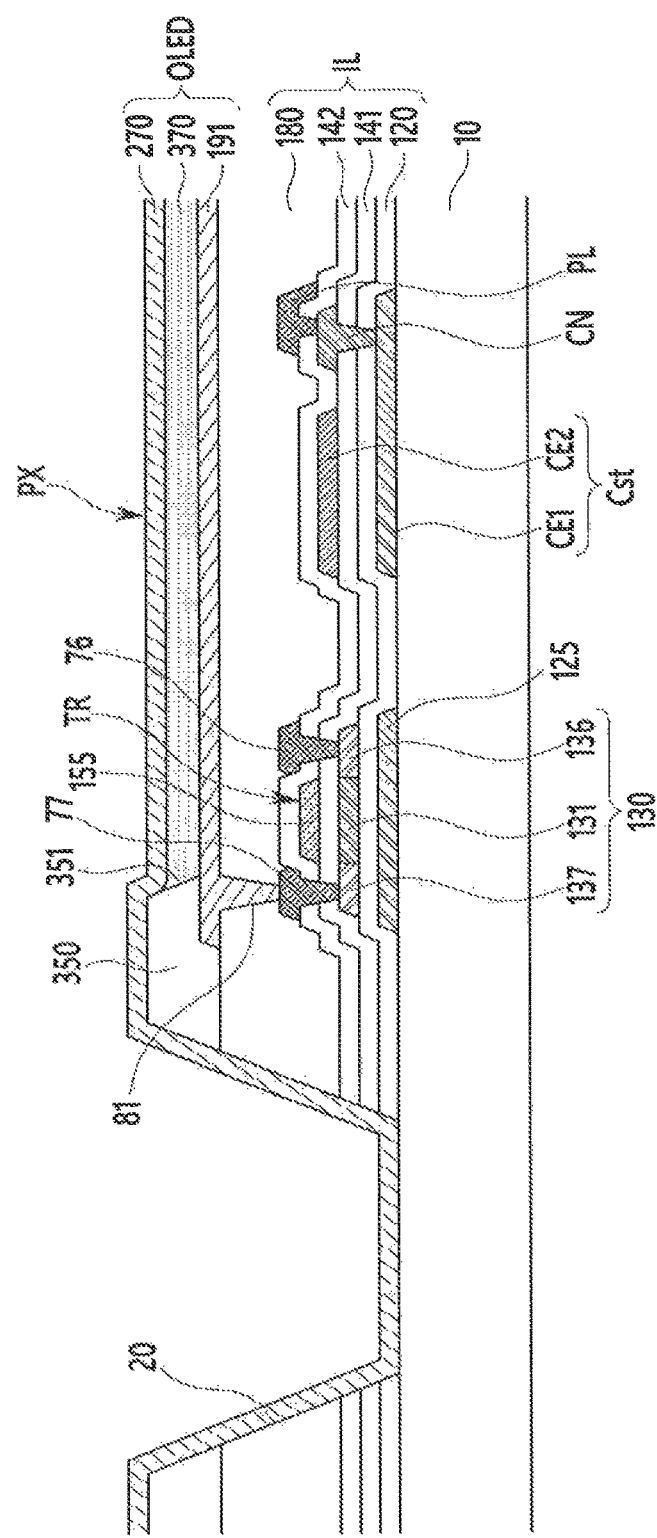
FIG. 2 is a cross-sectional view taken along the line II-II of FIG. 1.

FIG. 1 is a schematic layout view illustrating an organic light emitting diode display according to an exemplary embodiment of the present disclosure. FIG. 2 is a cross-sectional view taken along the line II-II of FIG. 1.

As shown in FIG. 1, the organic light emitting diode display according to an exemplary embodiment of the present disclosure includes a substrate 10 having a pixel area PA and a transmissive area TA. Pixels PX are disposed in the pixel area PA of the substrate 10 for displaying images. A plurality of transmitting windows 20 is disposed in the transmissive area TA and the transmitting windows 20 are separated from the pixels PX in a first direction X. The transmitting windows 20 transmit light therethrough.

The substrate 10 may be an insulating substrate formed of glass, quartz, ceramic, plastic, or the like, or may be a metal substrate formed of stainless steel or the like.

The pixels PX may include a first pixel PX1, a second pixel PX2, and a third pixel PX3. The first pixel PX1, the second pixel PX2, and the third pixel PX3 each emit light so that various colors may be realized. Each of the first pixel PX1, the second pixel PX2, and the third pixel PX3 may include a transistor TR and capacitor Cst for turning the corresponding pixel on or off. The capacitor Cst may be connected to the transistor TR, but the present invention is not limited thereto.

The first pixel PX1, the second pixel PX2, and the third pixel PX3 may display different colors from each other. For example, the first pixel PX1 may display a blue color, the second pixel PX2 may display a green color, and a third pixel PX3 may display a red color. However, the present invention is not limited thereto. The first pixel PX1, the second pixel PX2, and the third pixel PX3 may display various different colors. The pixels PX may further include an additional pixel (e.g. a pixel PX4) for displaying another color in addition to the first pixel PX1, the second pixel PX2, and the third pixel PX3. The additional pixel may display a white color. Alternatively, the pixels PX1 through PX4 may be used to display blue, yellow, cyan and magenta.

The first pixel PX1, the second pixel PX2, and the third pixel PX3 may have different sizes. In FIG. 1, it is illustrated that the first pixel PX1 has a largest size, and the third pixel PX3 has a smallest size, but the present invention is not limited thereto. The sizes of the first pixel PX1, the second pixel PX2, and the third pixel PX3 may be variously adjusted. Alternatively, the first pixel PX1, the second pixel PX2, and the third pixel PX3 may have substantially the same sizes.

The transmitting windows 20 minimize a loss of transmittance, and transmit external light therethrough. In FIG. 1, each of the transmitting windows 20 is illustrated to have a planar quadrangular shape, but the present invention is not limited thereto. For example, a planar shape of each of the transmitting windows 20 may be polygonal such as a triangle, a pentagon, a hexagon, or a heptagon. Each of the transmitting windows may alternatively have a curved shape such as that of an octagon, a circle, an ellipse, a closed loop, or an open loop.

According to an exemplary embodiment of the present invention, the organic light emitting diode display may use the transmitting windows 20 to serve as a transparent organic light emitting diode display.

In FIG. 1, it is illustrated that one transmitting window 20 is disposed close to the first pixel PX1, the second pixel PX2, and the third pixel PX3. However, the present invention is not limited thereto. Three divided transmitting windows 20 may be respectively disposed close to the first pixel PX1, the second pixel PX2, and the third pixel PX3. Alternatively, one transmitting window 20 may be disposed close to all three of the pixels.

Hereinafter, detailed structures of the pixels and the transmitting windows will be described with reference to FIG. 2.

As shown in FIG. 2, each of the pixels PX includes a transistor TR including a plurality of electrode members 125, 130, 155, 76, and 77 disposed on the substrate 10 in various different layers. A plurality of insulating layers IL is disposed on the substrate 10 in various different layers to insulate the electrode members 125, 130, 155, 76, and 77 from each other. A capacitor Cst is connected to the transistor TR, and an organic light emitting diode OLED is also connected to the transistor TR.

The electrode members 125, 130, 155, 76, and 77 include a light-blocking electrode 125 disposed on the substrate 10, a semiconductor member 130 disposed to overlap the light-blocking electrode 125, a gate electrode 155 disposed to overlap the semiconductor member 130, and a source electrode 76 and a drain electrode 77 disposed to face each other based on the gate electrode 155. The light-blocking electrode 125 can prevent the semiconductor member 130 from deteriorating and can minimize a current leakage of the transistor TR by blocking external light traveling toward the semiconductor member 130. The light-blocking electrode 125 is connected to the gate electrode 155, but the present invention is not limited thereto.

In exemplary embodiments of the present invention, the light-blocking electrode 125 may be included among the electrode members 125, 130, 155, 76, and 77, but the present invention is not limited thereto. For example, the light-blocking electrode 125 might not be included among the electrode members 130, 155, 76, and 77.

The semiconductor member 130 includes a channel 131 overlapped with the gate electrode 155, and a source region 136 and a drain region 137 disposed at opposite sides of the channel 131. According to some exemplary embodiments of the present invention, the source region 136 and the drain region 137 may switch places with each other.

The insulating layers IL include a first insulating layer 120 disposed to cover the light-blocking electrode 125, a second insulating layer 141 disposed to cover the semiconductor member 130, a third insulating layer 142 disposed to cover the gate electrode 155, and a fourth insulating layer 180 disposed to cover the source electrode 76 and the drain electrode 77. The insulating layers IL are disposed in different layers on the substrate 10 to insulate the light-blocking electrode 125 from each of the electrode members 130, 155, 76, and 77.

The insulating layers IL may have at least one opening or groove, and the opening and the groove constitute the transmitting window 20. As a result, the transmitting window 20 includes at least one of the insulating layers IL and at least one of the opening and the groove.

Each of the first insulating layer 120, the second insulating layer 141, and the third insulating layer 142 may include an oxide and/or a nitride, e.g., a silicon nitride ($SiN_x$) and/or a silicon oxide ($SiO_x$). The fourth insulating layer 180 may include a stacked layer of an organic material such as a polyacryl-based resin or a polyimide-based resin, or an organic material and an inorganic material.

The capacitor Cst is connected to the transistor TR. The capacitor Cst may be electrically connected to a power supply line PL to which power is applied. The power supply line PL may be a driving voltage line 172 (see FIG. 4) for transferring a driving voltage ELVDD, but the present invention is not limited thereto.

The capacitor Cst includes a first capacitor electrode CE1 and a second capacitor electrode CE2.

The first capacitor electrode CE1 is disposed on the substrate at a same layer as that of the light-blocking electrode 125. The first capacitor electrode CE1 is connected to the power supply line PL through a connector CN.

The power supply line PL is included in the organic light emitting diode display, and is disposed at a same layer as that of the source electrode 76. The power supply line PL contacts the first capacitor electrode CE1 through the insulating layers IL.

The connector CN is included in the organic light emitting diode display, and is disposed at a same layer as that of the gate electrode 155. The power supply line PL and the first capacitor electrode CE are connected to each other by the connector CN.

The second capacitor electrode CE2 is disposed at a same layer as that of the gate electrode 155. The second capacitor electrode CE2 is connected to the gate electrode 155 of the transistor TR, but the present invention is not limited thereto. For example, the second capacitor electrode CE2 may be disposed at a same layer as that of one of the other electrode members 130, 155, 76, and 77.

Among the insulating layers IL, the first insulating layer 120 disposed between the first capacitor electrode CE1 and the second capacitor electrode CE2 is thinner than the second insulating layer 141 and the third insulating layer 142. The first insulating layer 120 is an insulating layer that contacts the light-blocking electrode 125.

Accordingly, capacitance of the capacitor Cst is increased by reducing a distance between the first capacitor electrode CE1 and the second capacitor electrode CE2 which are overlapped with each other, interposing the first insulating layer 120 and second insulating layer 141 therebetween.

A pixel electrode 191, serving as a first electrode, is disposed on the fourth insulating layer 180. The drain electrode 77 is connected to the pixel electrode 191 through a contact hole 81 formed in the fourth insulating layer 180. A pixel definition layer (PDL) 350 is disposed on edges of the fourth insulating layer 180 and the pixel electrode 191 to cover the edges. The pixel definition layer 350 has a pixel opening 351 that is overlapped with the pixel electrode 191. An organic emission layer 370 is disposed on the pixel electrode 191, and a common electrode 270, serving as a second electrode, is disposed on the organic emission layer 370. The pixel electrode 191, the organic emission layer 370, and the common electrode 270 constitute the organic light emitting diode OLED.

An encapsulation part may be disposed on the organic light emitting diode OLED, and the encapsulation part may be formed as an encapsulation thin film or an encapsulation substrate.

According to an exemplary embodiment of the present invention, in the organic light emitting diode display including the transmitting windows 20, although external light is radiated to the semiconductor member 130 of the transistor TR through the transmitting windows 20, the light-blocking electrode 125 blocks the external light from reaching the semiconductor member 130, which suppresses deterioration of the semiconductor member 130 and minimizes a current leakage of the transistor TR.

In addition, in the organic light emitting diode display according to an exemplary embodiment of the present invention, the first capacitor electrode CE1 of the capacitor Cst is disposed at a same layer as that of the light-blocking electrode 125, and the second capacitor electrode CE2 is disposed at a same layer as that of one of the electrode members 130, 155, 76, and 77. Accordingly, it is not necessary to form the capacitor Cst by using an additional process. As a result, the number of masks used in the manufacturing process can be reduced.

It may therefore be possible to provide an organic light emitting diode display that is capable of minimizing a current leakage and the number of masks used in the manufacturing process thereof.

Hereinafter, a detailed structure of the organic light emitting diode display illustrated in FIG. 1 and FIG. 2 will be described with reference to FIG. 3 and FIG. 4.

Figure 3:
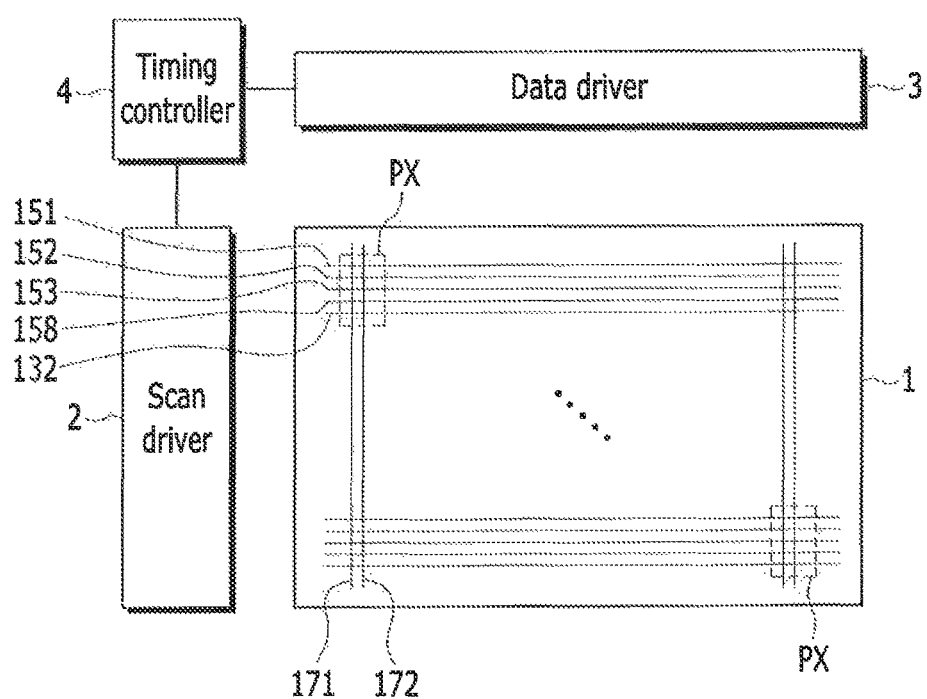
FIG. 3 is a top plan view illustrating the organic light emitting diode display of FIG. 1.

FIG. 3 is a top plan view illustrating the organic light emitting diode display of FIG. 1. FIG. 4 is an equivalent circuit diagram illustrating a pixel of the organic light emitting diode display of FIG. 1.

As shown in FIG. 3, the organic light emitting diode display, according to an exemplary embodiment of the present invention, includes a display panel 1 for displaying an image, a scan driver 2, a data driver 3, and a timing controller 4. The display panel 1 includes a plurality of signal lines 151, 152, 153, 158, 171, 172, and 132, and pixels PX disposed substantially in a matrix form are connected to the signal lines 151, 152, 153, 158, 171, 172, and 132.

Figure 4:
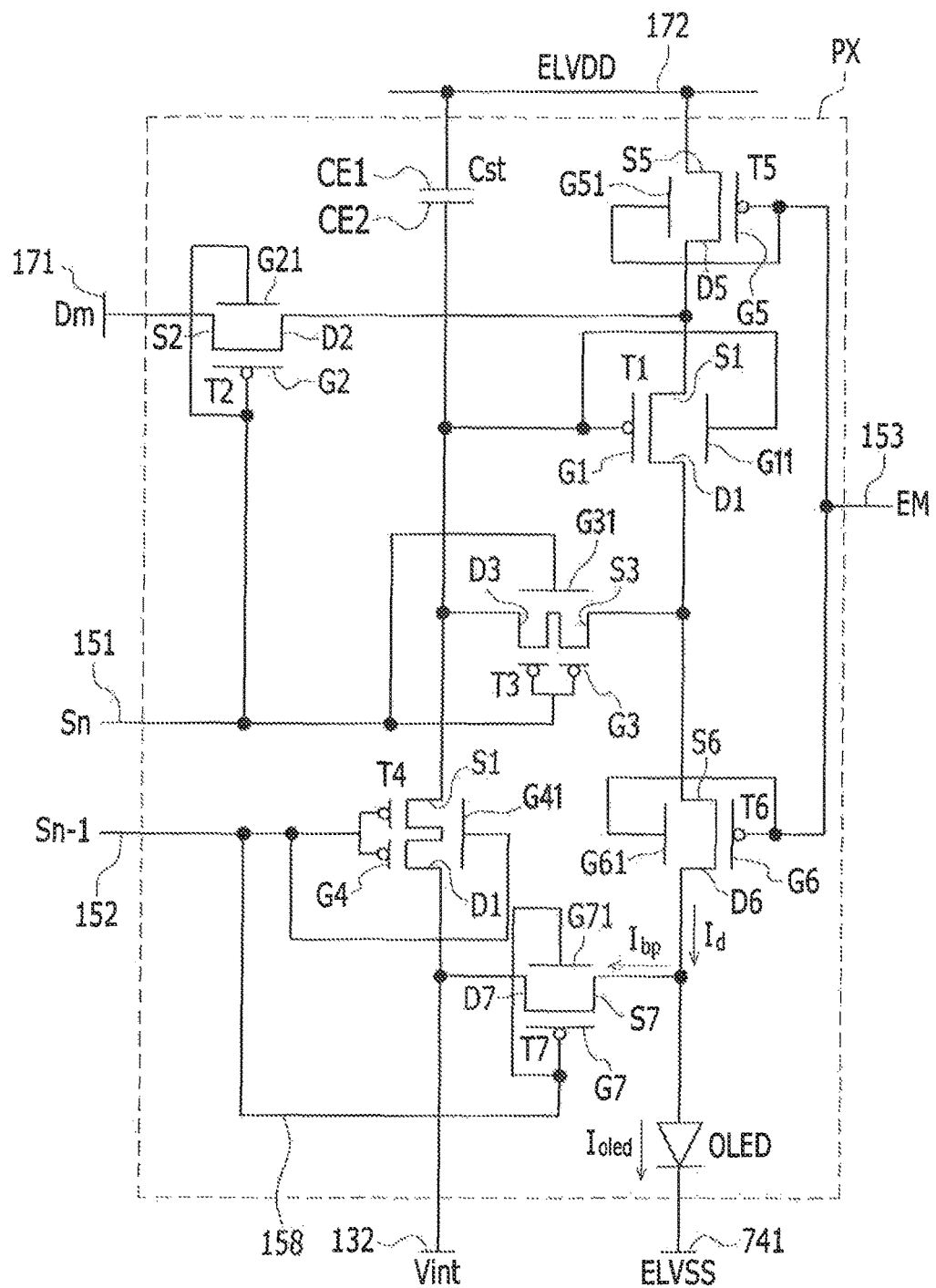
FIG. 4 is an equivalent circuit diagram illustrating a pixel of the organic light emitting diode display of FIG. 1.

As shown in FIG. 4, the pixels PX include a plurality of transistors T1, T2, T3, T4, T5, T6, and T7 connected to the signal lines 151, 152, 153, 158, 171, 172, and 132, a capacitor Cst, and an organic light emitting diode OLED.

The transistors T1, T2, T3, T4, T5, T6, and T7 include a first transistor T1, a second transistor T2, a third transistor T3, a fourth transistor T4, a fifth transistor T5, a sixth transistor T6, and a seventh transistor T7. The first transistor T1, the second transistor T2, and the third transistor T3 may respectively serve as a driving transistor, a switching transistor, and a compensation transistor. The fourth transistor T4, the fifth transistor T5, the sixth transistor T6, and the seventh transistor T7 may respectively serve as an initialization transistor, an operation control transistor, a light emission control transistor, and a bypass transistor.

The signal lines 151, 152, 153, 158, 171, 172, and 132 may include a scan line 151, a previous scan line 152, a light-emitting control line 153, a bypass control line 158, a data line 171, the driving voltage line 172, and an initialization voltage line 132.

The scan line 151 may transfer a scan signal Sn, the previous scan line 152 transfers a previous scan signal Sn−1 to the initialization transistor T4, the light-emitting control line 153 transfers a light-emitting control signal EM to the operation control transistor T5 and the light emission control transistor T6, and the bypass control line 158 is connected to the previous scan line 152 to transfer the previous scan signal Sn−1 to the bypass transistor T7.

The data line 171 crosses the scan line 151 to transfer a data signal Dm. The driving voltage line 172 is disposed substantially in parallel with the data line 171 to transfer a driving voltage ELVDD. The initialization voltage line 132 transfers an initialization voltage Vint for initializing the driving transistor T1.

Each of the scan line 151, the previous scan line 152, the light-emitting control line 153, the bypass control line 158, the data line 171, the driving voltage line 172, and the initialization voltage line 132 is connected to one corresponding pixel PX.

A gate electrode G1 of the driving transistor T1 is connected to the second capacitor electrode CE2 of the capacitor Cst. A source electrode S1 of the driving transistor T1 is connected to the driving voltage line 172 via the operation control transistor T5. A drain electrode D1 of the driving transistor T1 is electrically connected to an anode of the organic light emitting diode OLED via the light emission control transistor T6. The driving transistor T1 supplies a driving current Id to the organic light emitting diode OLED by receiving the data signal Dm according to a switching operation of the switching transistor T2

A gate electrode G2 of the switching transistor T2 is connected to the scan line 151. A source electrode S2 of the switching transistor T2 is connected to the data line 171. A drain electrode D2 of the switching transistor T2 is connected to the source electrode S1 of the driving transistor T1 and with the driving voltage line 172 via the operation control transistor T5. The switching transistor T2 is turned on according to a scan signal Sn transferred through the scan line 151. The switching transistor T2 performs a switching operation for transferring the data signal Dm to the source electrode S1 of the driving transistor T1.

A gate electrode G3 of the compensation transistor T3 is connected to the scan line 151. A source electrode S3 of the compensation transistor T3 is connected to the drain electrode D1 of the driving transistor T1 and with the anode of the organic light emitting diode OLED via the light emission control transistor T6. A drain electrode D3 of the compensation transistor T3 is connected to a drain electrode D4 of the initialization transistor T4, the second capacitor electrode CE2 of the capacitor Cst, and the gate electrode G1 of the driving transistor T1. The compensation transistor T3 is turned on according to the scan signal Sn transferred through the scan line 151 so as to diode-connect the driving transistor T1 by connecting the gate electrode G1 and the drain electrode D1 of the driving transistor T1 with each other.

A gate electrode G4 of the initialization transistor T4 is connected to the previous scan line 152. A source electrode S4 of the initialization transistor T4 is connected to the initialization voltage line 132. The drain electrode D4 of the initialization transistor T4 is connected to the second capacitor electrode CE2 of the capacitor Cst and the gate electrode G1 of the driving transistor T1. The initialization transistor T4 is turned on according to the previous scan signal Sn−1 transferred through the previous scan line 152 to perform an initializing operation for initializing a gate voltage Vg of the gate electrode G1 of the driving transistor T1 by transferring an initialization voltage Vint of the gate electrode G1 of the driving transistor T1.

Each of the compensation transistor T3 and the initialization transistor T4 is configured to have a dual-gate structure so as to block a current leakage.

In this case, a light-blocking electrode G11 connected to the gate electrode G1 of the driving transistor T1 minimizes a current leakage of the driving transistor T1 caused by external light. Further, a light-blocking electrode G21 connected to the gate electrode G2 of the switching transistor T2 minimizes a current leakage of the switching transistor T2 caused by external light. A light-blocking electrode G31 connected to the gate electrode G3 of the compensation transistor T3 minimizes a current leakage of the compensation transistor T3 caused by external light, and a light-blocking electrode G41 connected to the gate electrode G4 of the initialization transistor T4 minimizes a current leakage of the initialization transistor T4 caused by external light.

A gate electrode G5 of the operation control transistor T5 is connected to the light-emitting control line 153, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emission control transistor T6 is connected to the light-emitting control line 153. A source electrode S6 of the light emission control transistor T6 is connected to the drain electrode D1 of the driving transistor T1 and the source electrode S3 of the compensation transistor T3. A drain electrode D6 of the light emission control transistor T6 is electrically connected to the anode of the organic light emitting diode OLED. The operation control transistor T5 and the light emission control transistor T6 are simultaneously turned on according to the light-emitting control signal EM transferred through the light-emitting control line 153 to compensate the driving voltage ELVDD through the diode-connected driving transistor T1 and to transfer it to the organic light emitting diode OLED.

A gate electrode G7 of the bypass transistor T7 is connected to the bypass control line 158. A source electrode S7 of the bypass transistor T7 is connected to the drain electrode D6 of the light emission control transistor T6 and the anode of the organic light emitting diode OLED. A drain electrode D7 of the bypass transistor T7 is connected to the initialization voltage line 132 and the source electrode S4 of the initialization transistor T4. Accordingly, in the case of displaying a black image, a light-emitting current $I_{oled}$ of the organic light emitting diode OLED is reduced by a current amount of the bypass current Ibp passing through the bypass transistor T7 from the driving current Id. The light-emitting current $I_{oled}$ has a minimum current amount which is a minimum level capable of displaying the black image. Accordingly, it is possible to realize a precise black luminance image by using the bypass transistor T7, thereby increasing a contrast ratio.

In this case, a light-blocking electrode G51 connected to the gate electrode G5 of the operation control transistor T5 minimizes a current leakage of the operation control transistor T5 caused by external light. Further, a light-blocking electrode G61 connected to the gate electrode G6 of the light emission control transistor T6 minimizes a current leakage of the light emission control transistor T6 caused by external light. A light-blocking electrode G71 connected to the gate electrode G7 of the bypass transistor T7 minimizes a current leakage of the bypass transistor T7 caused by external light.

The first capacitor electrode CE1 of the capacitor Cst is connected to the driving voltage line 172, and a cathode of the organic light emitting diode OLED is connected to a common voltage line 741 for transferring a common voltage ELVSS.

The scan driver 2 transfers the scan signal Sn to the scan line 151. The data driver 3 transfers the data signal Dm to the data line 171. The timing controller 4 generates a scan control signal, a data control signal, an RGB signal, and the like by receiving various control signals and image signals from an external system. The timing controller 4 transfers these signals to the scan driver 2 and the data driver 3.

The structure including seven transistors and one capacitor is illustrated in FIG. 3 and FIG. 4, but the present invention is not limited thereto. For example, the numbers of the transistors and the capacitors may be variously adjusted.

Hereinafter, a detailed structure of the organic light emitting diode display shown in FIG. 1, FIG. 2, FIG. 3, and FIG. 4 will be described with reference to FIG. 5, FIG. 6, FIG. 7, and FIG. 8.

Figure 5:
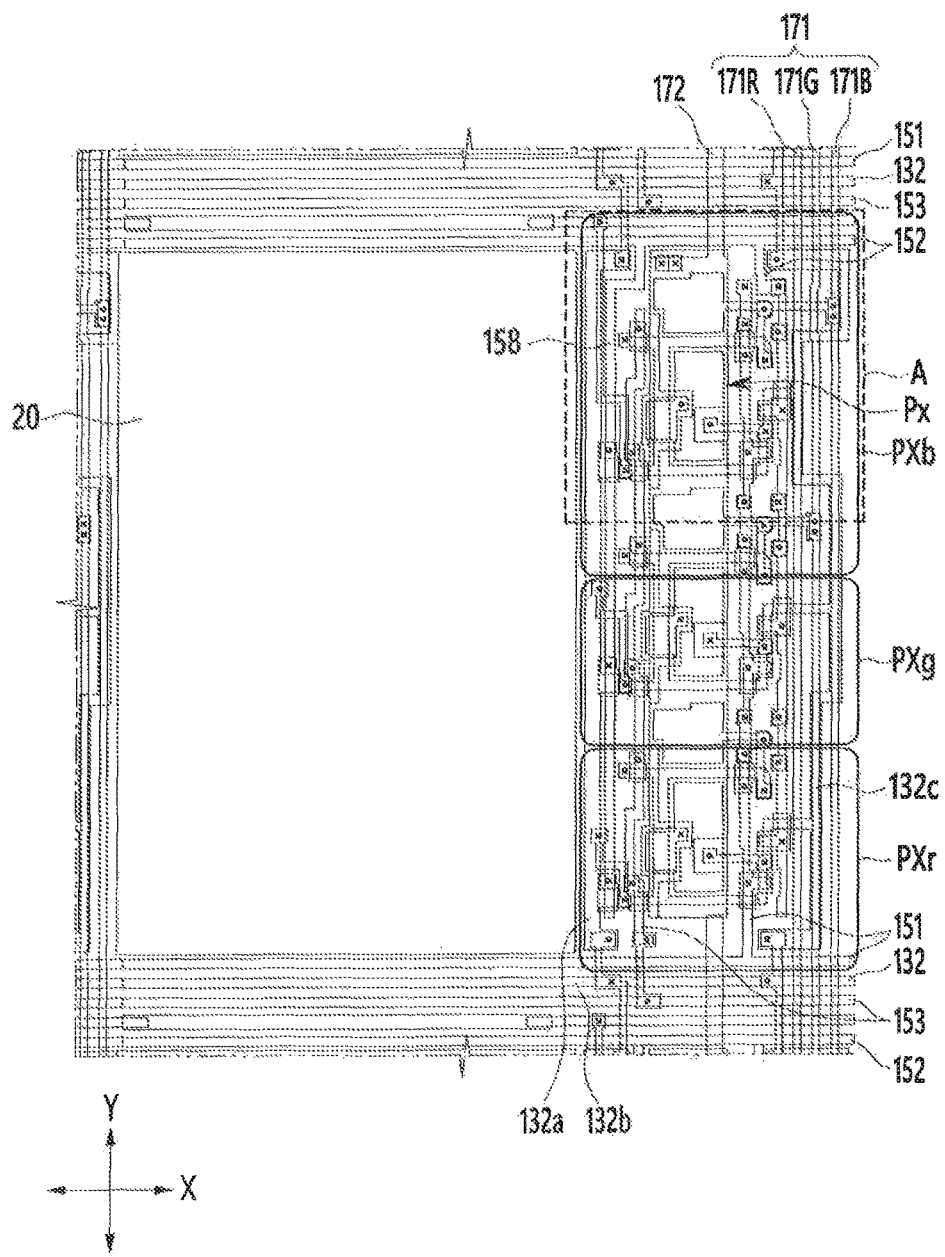
FIG. 5 is a detailed layout view illustrating an organic light emitting diode display according to an exemplary embodiment of the present disclosure.

FIG. 5 is a detailed layout view illustrating an organic light emitting diode display according to an exemplary embodiment of the present invention.

As shown in FIG. 5, the organic light emitting diode display includes pixels PX and transmitting windows 20 disposed adjacently thereto.

The pixels PX include a blue pixel PXb, a green pixel PXg, and a red pixel PXr which are sequentially disposed in a second direction Y.

The scan line 151, the previous scan line 152, and the light-emitting control line 153 are extended in a first direction X and respectively apply the scan signal Sn, the previous scan signal Sn-1, and the light-emitting control signal EM. The scan line 151, the previous scan line 152, and the light-emitting control line 153 are disposed above and below the transmitting window 20 and the pixels PX. The light-emitting control line 153 includes the bypass control line 158 which is extended in the second direction Y into the pixels PX.

The data line 171, which applies the data signal Dm to the pixels PX, is disposed to cross the scan line 151, the previous scan line 152, and the light-emitting control line 153.

The data line 171 includes a first data line 171R for applying the data signal Dm to the red pixel PXr, a second data line 171G for applying the data signal Dm to the green pixel PXg, and a third data line 171B for applying the data signal Dm to the blue pixel PXb.

The driving voltage line 172, for applying the driving voltage ELVDD to the pixels PX, is extended in the second direction Y that is parallel with the data line 171.

The initialization voltage line 132 for applying the initialization voltage Vint to the pixels PX includes a first initialization voltage line 132a and a third initialization voltage line 132c disposed in parallel with the data line 171. A second initialization voltage line 132b is disposed in parallel with the scan line 151. The first initialization voltage line 132a and the second initialization voltage line 132b are connected to each other through a contact hole. The third initialization voltage line 132c and the second initialization voltage line 132b are connected to each other through a contact hole.

Figure 6:
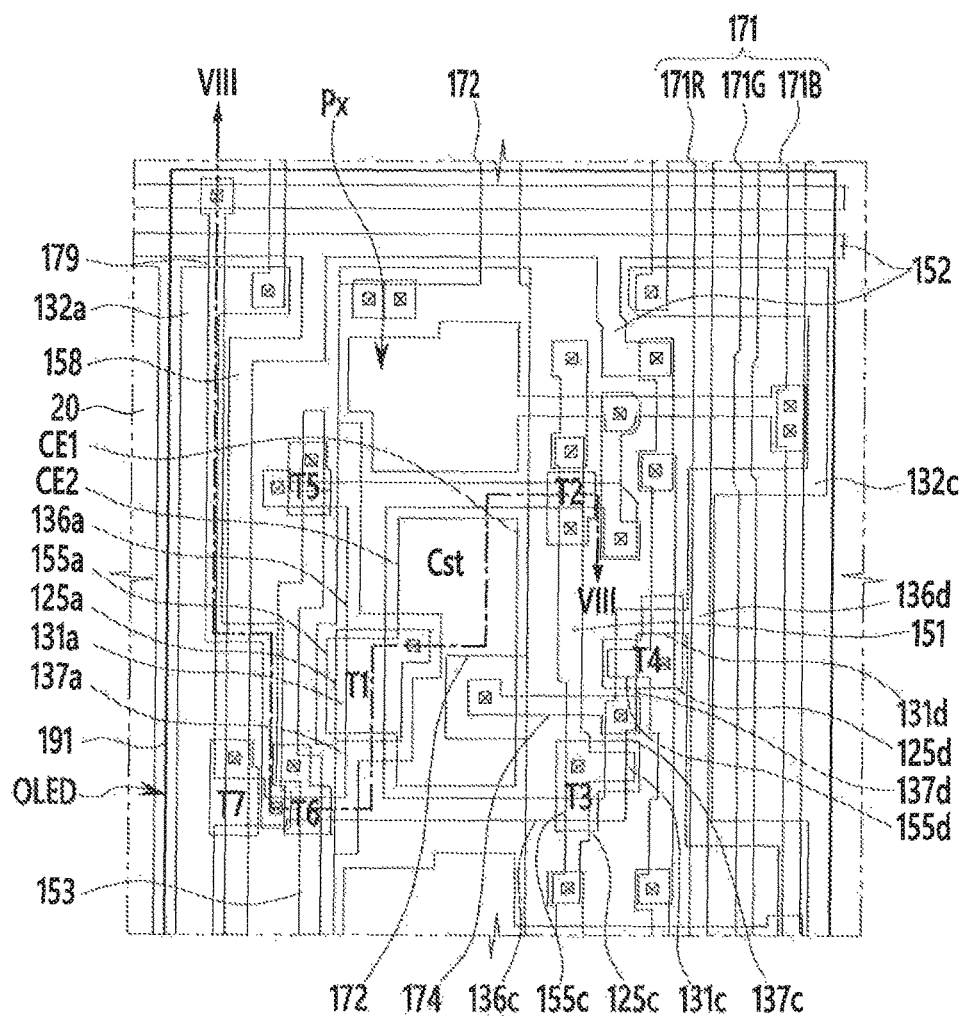
FIG. 6 is an enlarged layout view of a region A of FIG. 5, illustrating a driving transistor, a switching transistor, a compensation transistor, an initialization transistor, and a capacitor.
Figure 6:
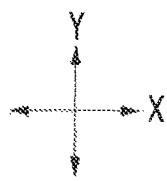
Figure 7:
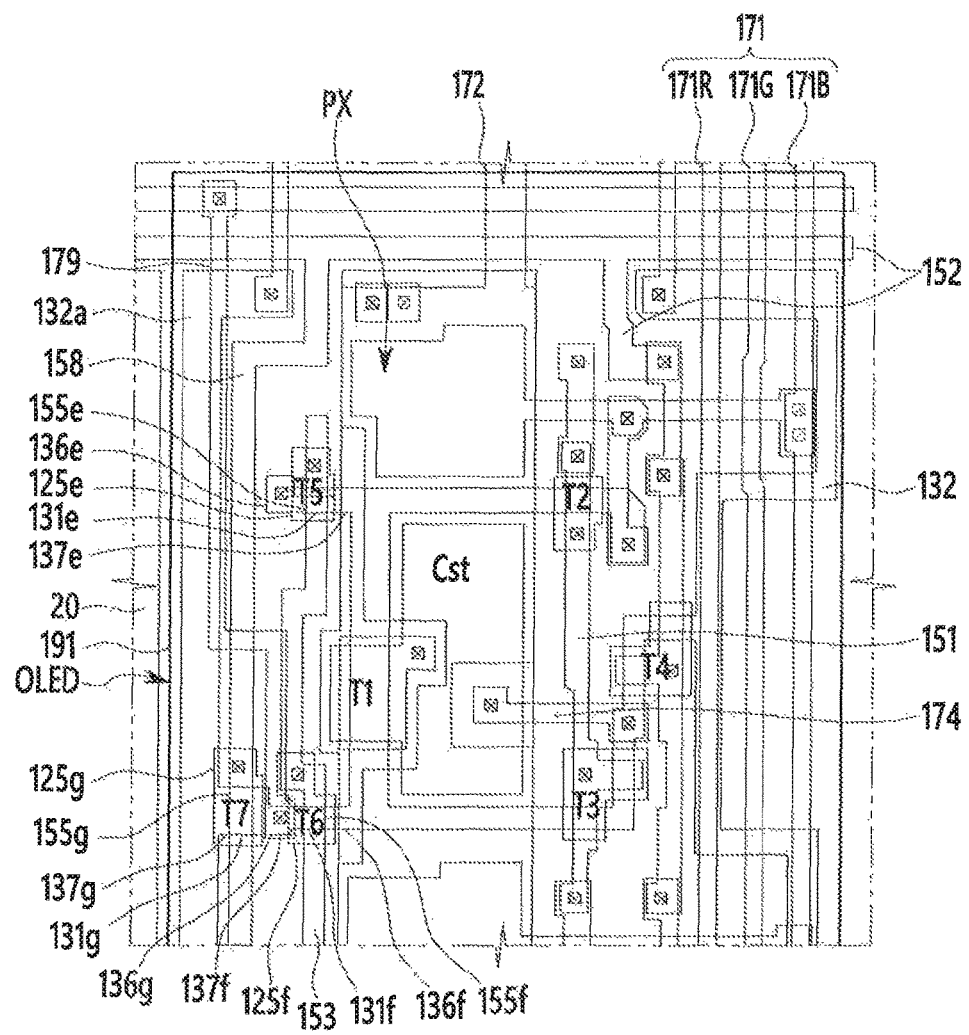
FIG. 7 is an enlarged layout view of a region A of FIG. 5, illustrating an operation control transistor, a light emission control transistor, and a bypass transistor.
Figure 8:
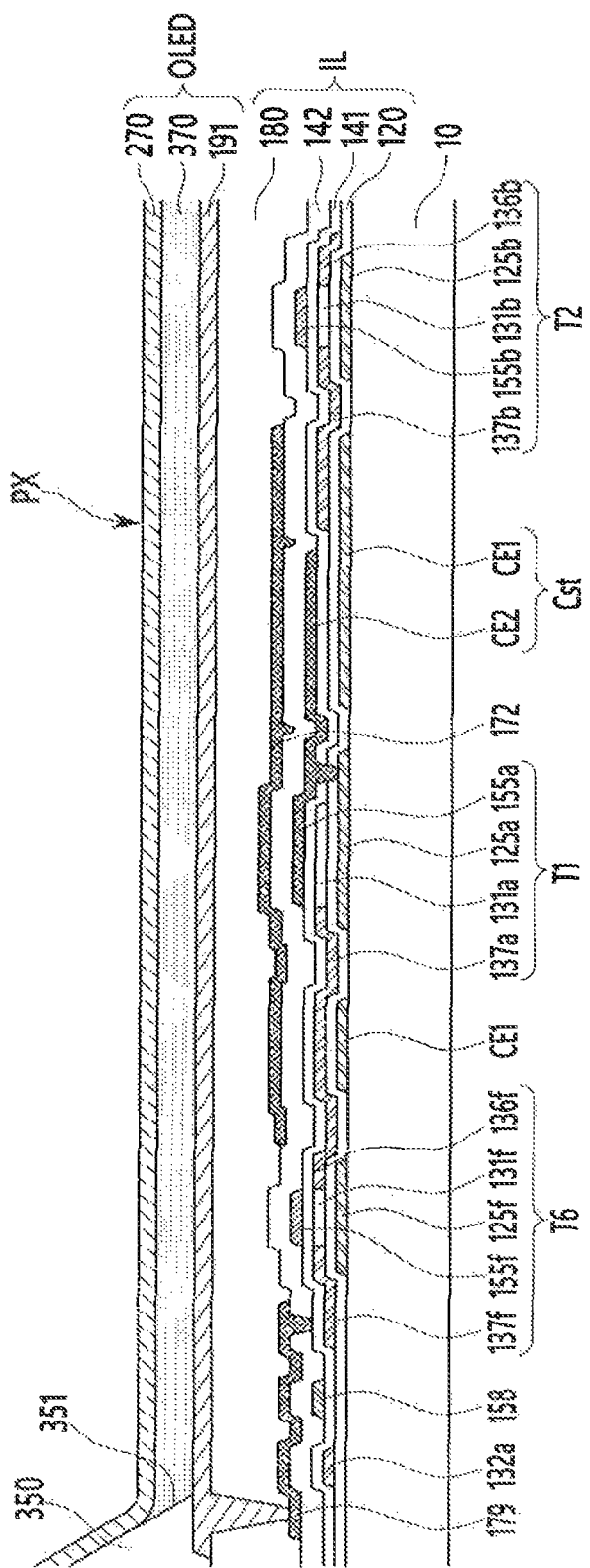
FIG. 8 is a cross-sectional view taken along the line VIII-VIII of FIG. 6.

FIG. 6 is an enlarged layout view of a region A of FIG. 5, illustrating a driving transistor, a switching transistor, a compensation transistor, an initialization transistor, and a capacitor. FIG. 7 is an enlarged layout view of a region A of FIG. 5, illustrating an operation control transistor, a light emission control transistor, and a bypass transistor. FIG. 8 is a cross-sectional view taken along the line VIII-VIII of FIG. 6.

As shown in FIG. 6, FIG. 7 and FIG. 8, each of the blue pixel PXb, the green pixel PXg, and the red pixel PXr, included in the pixels PX, includes a driving transistor T1, a switching transistor T2, a compensation transistor T3, an initialization transistor T4, an operation control transistor T5, a light emission control transistor T6, a bypass transistor T7, a capacitor Cst, a plurality of insulating layers IL, and an organic light emitting diode OLED, which are disposed on the substrate 10.

The driving transistor T1 includes a driving light-blocking electrode 125a, a driving channel 131a, a driving gate electrode 155a, a driving source electrode 136a, and a driving drain electrode 137a.

The driving light-blocking electrode 125a and the driving gate electrode 155a are overlapped with the driving channel 131a. The driving source electrode 136a and the driving drain electrode 137a are respectively adjacently disposed at opposite sides of the driving channel 131a. The driving light-blocking electrode 125a and the driving gate electrode 155a are connected to each other through a contact hole. The driving gate electrode 155a is connected to a driving connecting member 174 through a contact hole. The driving light-blocking electrode 125a is disposed below the driving channel 131a to block introduction of external light into the driving channel 131a. Accordingly, a current leakage caused by external light can be minimized.

The switching transistor T2 includes a switching light-blocking electrode 125b, a switching channel 131b, a switching gate electrode 155b, a switching source electrode 136b, and a switching drain electrode 137b. The switching light-blocking electrode 125b and the switching gate electrode 155b are overlapped with the switching channel 131b. The switching gate electrode 155b, which is a part of the scan line 151, is overlapped with the switching channel 131b. The switching source electrode 136b and the switching drain electrode 137b are respectively adjacently disposed at opposite sides of the switching channel 131b. The switching source electrode 136b is connected to the data line 171 through a contact hole. The switching light-blocking electrode 125b is disposed below the switching channel 131b to block introduction of external light into the switching channel 131b. Accordingly, a current leakage caused by external light can be minimized.

The compensation transistor T3 includes a compensation light-blocking electrode 125c, a compensation channel 131c, a compensation gate electrode 155c, a compensation source electrode 136c, and a compensation drain electrode 137c. The compensation gate electrode 155c, which is a part of the scan line 151, includes two gate electrodes for preventing a current leakage. The two gate electrodes are overlapped with the compensation channel 131c. The compensation source electrode 136c and the compensation drain electrode 137c are respectively adjacently disposed at opposite sides of the compensation channel 131c. The compensation light-blocking electrode 125c and the compensation gate electrode 155c are connected to each other through a contact hole. The compensation drain electrode 137c is connected to the driving connecting member 174 through a contact hole. The compensation light-blocking electrode 125c is disposed below the compensation channel 131c to block introduction of external light into the compensation channel 131c. Accordingly, a current leakage caused by external light can be minimized.

The initialization transistor T4 includes an initialization light-blocking electrode 125d, an initialization channel 131d, an initialization gate electrode 155d, an initialization source electrode 136d, and an initialization drain electrode 137d. The initialization gate electrode 155d, which is a part of the previous scan line 152, includes two initialization channels for preventing a current leakage. The two initialization channels are overlapped with the initialization channel 131d. The initialization source electrode 136d and the initialization drain electrode 137d are respectively adjacently disposed at opposite ends of the initialization channel 131d. The initialization light-blocking electrode 125d and the initialization gate electrode 155d are connected to each other through a contact hole. The initialization light-blocking electrode 125d is disposed below the initialization channel 131d to block introduction of external light into the initialization channel 131d. Accordingly, a current leakage caused by external light can be minimized.

The operation control transistor T5 includes an operation control light-blocking electrode 125e, an operation control channel 131e, an operation control gate electrode 155e, an operation control source electrode 136e, and an operation control drain electrode 137e. The operation control gate electrode 155e, which is a part of the light-emitting control line 153, is overlapped with the operation control channel 131e. The operation control source electrode 136e and the operation control drain electrode 137e are respectively adjacently disposed at opposite ends of the operation control channel 131e. The operation control source electrode 136e is connected to the driving voltage line 172 through a contact hole. The operation control light-blocking electrode 125e and the operation control gate electrode 155e are connected to each other through a contact hole. The operation control light-blocking electrode 125e is disposed below the operation control channel 131e to block introduction of external light into the operation control channel 131e. Accordingly, a current leakage caused by external light can be minimized.

The light emission control transistor T6 includes a light emitting control light-blocking electrode 125f, a light emitting control channel 131f, a light emitting control gate electrode 155f, a light emitting control source electrode 136f, and a light emitting control drain electrode 137f. The light emitting control gate electrode 155f, which is a part of the light-emitting control line 153, is overlapped with the light emitting control channel 131f. The light emitting control source electrode 136f and the light emitting control drain electrode 137f are respectively adjacently disposed at opposite ends of the light emitting control channel 131f. The light emitting control drain electrode 137f is connected to a pixel connecting member 179 through a contact hole. The light emitting control light-blocking electrode 125f and the light emitting control gate electrode 155f are connected to each other through a contact hole. The light emitting control light-blocking electrode 125f is disposed below the light emitting control channel 131f to block introduction of external light into the light emitting control channel 131f. Accordingly, a current leakage caused by external light can be minimized.

The bypass transistor T7 includes a bypass light-blocking electrode 125g, a bypass channel 131g, a bypass gate electrode 155g, a bypass source electrode 136g, and a bypass drain electrode 137g. The bypass gate electrode 155g, which is a part of the previous scan line 152, is overlapped with the bypass channel 131g. The bypass source electrode 136g and the bypass drain electrode 137g are respectively adjacently disposed at opposite ends of the bypass channel 131g. The bypass source electrode 136g is directly connected to the light emitting control drain electrode 137f. The bypass light-blocking electrode 125g and the bypass gate electrode 155g are connected to each other through a contact hole. The bypass light-blocking electrode 125g is disposed below the bypass channel 131g to block introduction of external light into the bypass channel 131g. Accordingly, a current leakage caused by external light can be minimized.

Each of the driving channel 131a, the switching channel 131b, the compensation channel 131c, the initialization channel 131d, the operation control channel 131e, the light emitting control channel 131f, and the bypass channel 131g may include a polysilicon or oxide semiconductor material. The oxide semiconductor material may include an oxide of a metal such as zinc (Zn), indium (In), gallium (Ga), tin (Sn), or titanium (Ti), or a combination of the metal such as zinc (Zn), indium (In), gallium (Ga), tin (Sn), or titanium (Ti) and an oxide thereof. The oxide may include at least one of a zinc oxide (ZnO), a zinc-tin oxide (ZTO), a zinc-indium oxide (ZIO), an indium oxide (InO), a titanium oxide (TiO), an indium-gallium-zinc oxide (IGZO), or an indium-zinc-tin oxide (IZTO).

The capacitor Cst includes a first capacitor electrode CE1 and a second capacitor electrode CE2 disposed while interposing the first insulating layer 120 and the second insulating layer 141 therebetween.

The first capacitor electrode CE1 is disposed at a same layer as that of the driving light-blocking electrode 125a and is separated from the driving light-blocking electrode 125a. The first capacitor electrode CE1 is connected to the driving voltage line 172 through a contact hole. The first capacitor electrode CE1 is extended in a second direction Y. The first capacitor electrode CE1 is extended in the second direction Y along an extending direction of the driving voltage line 172. The first capacitor electrode CE1 is overlapped with the driving voltage line 172.

The second capacitor electrode CE2 is disposed at a same layer as that of the driving gate electrode 155a and is connected to the driving gate electrode 155a. The second capacitor electrode CE2 is extended from the driving gate electrode 155a to overlap the first capacitor electrode CE1. The second capacitor electrode CE2 is integrally formed with the driving gate electrode 155a. The second capacitor electrode CE2 is connected to the driving gate electrode 155a. The second capacitor electrode CE2 is connected to the driving connecting member 174 through a contact hole. The second capacitor electrode CE2 is connected to the compensation transistor T3 and the initialization transistor T4 through the driving connecting member 174.

The driving connecting member 174 is disposed at a same layer as that of the data line 171. The driving connecting member 174 is connected to the compensation drain electrode 137c of the compensation transistor T3 and the initialization drain electrode 137d of the initialization transistor T4 through contact holes. Accordingly, the driving connecting member 174 is connected to the driving gate electrode 155a through the second capacitor electrode CE2. The driving connecting member 174 connects the driving gate electrode 155a with the compensation drain electrode 137c of the compensation transistor T3. The driving connecting member 174 connects the driving gate electrode 155a with the initialization drain electrode 137d of the initialization transistor T4.

Accordingly, the capacitor Cst stores a storage capacitance corresponding to a difference between the driving voltage ELVDD transferred to the first capacitor electrode CE1 through the driving voltage line 172 and the driving gate voltage Vg of the driving gate electrode 155a.

The first insulating layer 120 and the second insulating layer 141 serve as a dielectric material. The storage capacitance is determined according to the charge accumulated in the capacitor Cst and a voltage between the first capacitor electrode CE1 and the second capacitor electrode CE2.

The insulating layers IL includes a first insulating layer 120 for covering the driving light-blocking electrode 125a, a second insulating layer 141 for covering the driving channel 131a, a third insulating layer 142 for covering the driving gate electrode 155a, and a fourth insulating layer 180 for covering the driving voltage line 172.

Each of the first insulating layer 120, the second insulating layer 141, and the third insulating layer 142 may include an oxide and/or a nitride, such as a silicon nitride (SiNx) or a silicon oxide ($SiO_x$). The fourth insulating layer 180 may include a stacked layer of organic materials such as a polyacryl-based resin and a polyimide-based resin, or a stacked layer of organic materials and inorganic materials.

The organic light emitting diode OLED includes a pixel electrode 191, an organic emission layer 370, and a common electrode 270.

The pixel electrode 191 may be disposed on the fourth insulating layer 180. The pixel connecting member 179 is connected to the pixel electrode 191 through a contact hole of the fourth insulating layer 180.

A pixel definition layer 350 is disposed on edges of the fourth insulating layer 180 and the pixel electrode 191 to cover the edges. The pixel definition layer 350 has a pixel opening 351 that is overlapped with the pixel electrode 191. The pixel definition layer 350 may include an organic material such as a polyacryl-based resin, a polyimide-based resin, or a silica-based inorganic material.

The organic emission layer 370 is disposed on the pixel electrode 191. The common electrode 270 serves as the second electrode and is disposed on the organic emission layer 370. The common electrode 270 may be disposed on the pixel definition layer 350 and may be formed throughout the pixels PX. The pixel electrode 191, the organic emission layer 370, and the common electrode 270 constitute the organic light emitting diode OLED.

Herein, the pixel electrode 191 is both an anode and a hole injection electrode. The common electrode 270 is both a cathode and an electron injection electrode. However, the present exemplary embodiment is not limited thereto, and the pixel electrode 191 may be the cathode while the common electrode 270 may be the anode.

An encapsulation part may be disposed on the organic light emitting diode OLED, and the encapsulation part may be formed as an encapsulation thin film or an encapsulation substrate.

Hereinafter, an organic light emitting diode display according to an exemplary embodiment of the present invention will be described with reference to FIG. 9. The description will focus on those parts that are different from those of the organic light emitting diode display described above with reference to FIG. 2.

Figure 9:
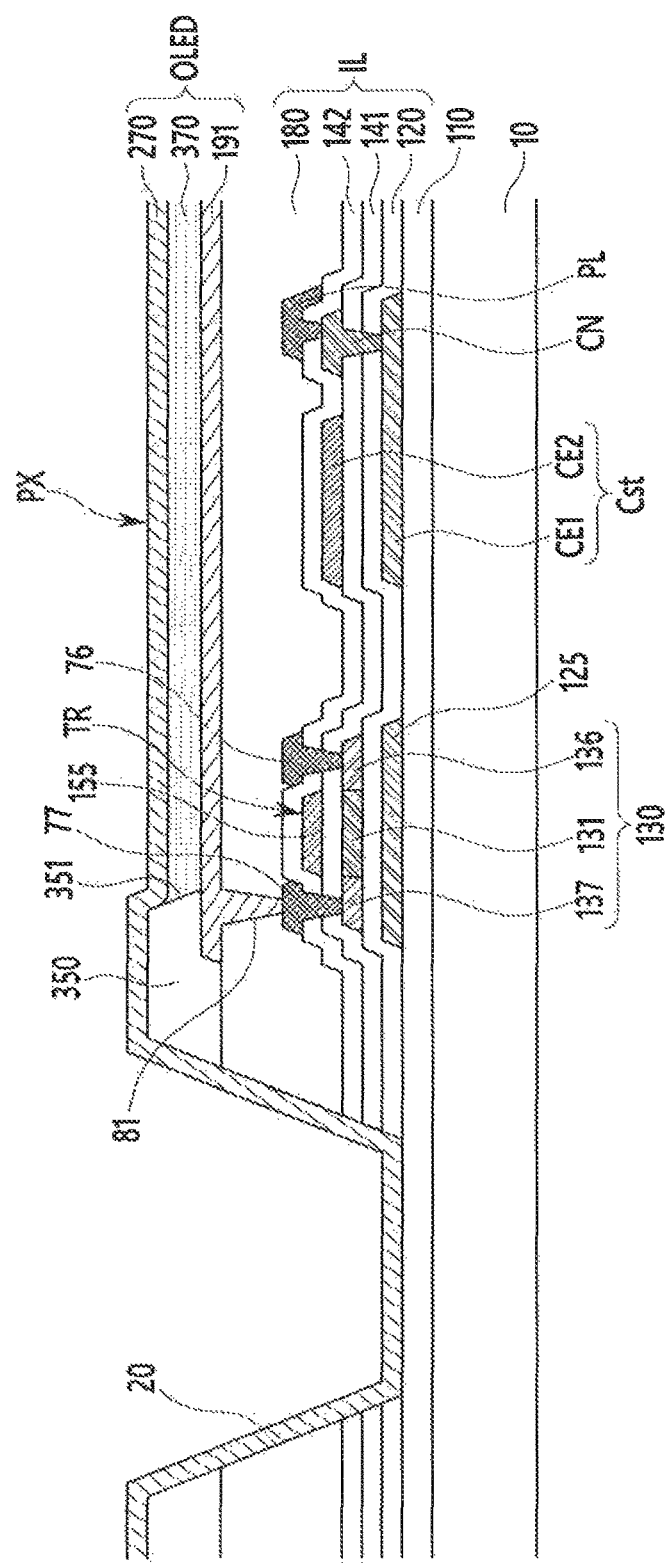
FIG. 9 is a cross-sectional view illustrating an organic light emitting diode according to an exemplary embodiment of the present disclosure.

FIG. 9 is a cross-sectional view illustrating an organic light emitting diode according to an exemplary embodiment of the present invention.

Referring to FIG. 9, each pixel PX of the organic light emitting diode display includes a transistor TR configured to include a plurality of electrode members 125, 130, 155, 76, and 77 disposed at different layers on the substrate 10, a plurality of insulating layers IL disposed at different layers on the substrate 10 to insulate the electrode members 125, 130, 155, 76, and 77 from each other, a capacitor Cst connected to the transistor TR, an organic light emitting diode OLED connected to the transistor TR, and a buffer layer 110.

The buffer layer 110 is disposed between the substrate 10 and the light-blocking electrode 125. The buffer layer 110 has a thickness that is larger than that of each of the plurality of insulating layers IL. The buffer layer 110 may include an oxide and/or a nitride, such as a silicon nitride (SiNx) or a silicon oxide (SiO$_x$). The buffer layer 110 may include a stacked layer of organic materials such as a polyacryl-based resin and a polyimide-based resin, or a stacked layer of organic materials and inorganic materials.

As such, it is possible to suppress an uneven portion from being formed in the first capacitor electrode CE1 or contamination of the first capacitor electrode CE1 which is disposed at a same layer as the light-blocking electrode 125, by disposing the substrate 10 and the light-blocking electrode 125. Accordingly, the organic light emitting diode display including the capacitor Cst having increased reliability is provided.

Hereinafter, an organic light emitting diode display according to an exemplary embodiment of the present invention will be described with reference to FIG. 10. The description will focus on those parts that are different from those of the organic light emitting diode display described with reference to FIG. 2.

Figure 10:
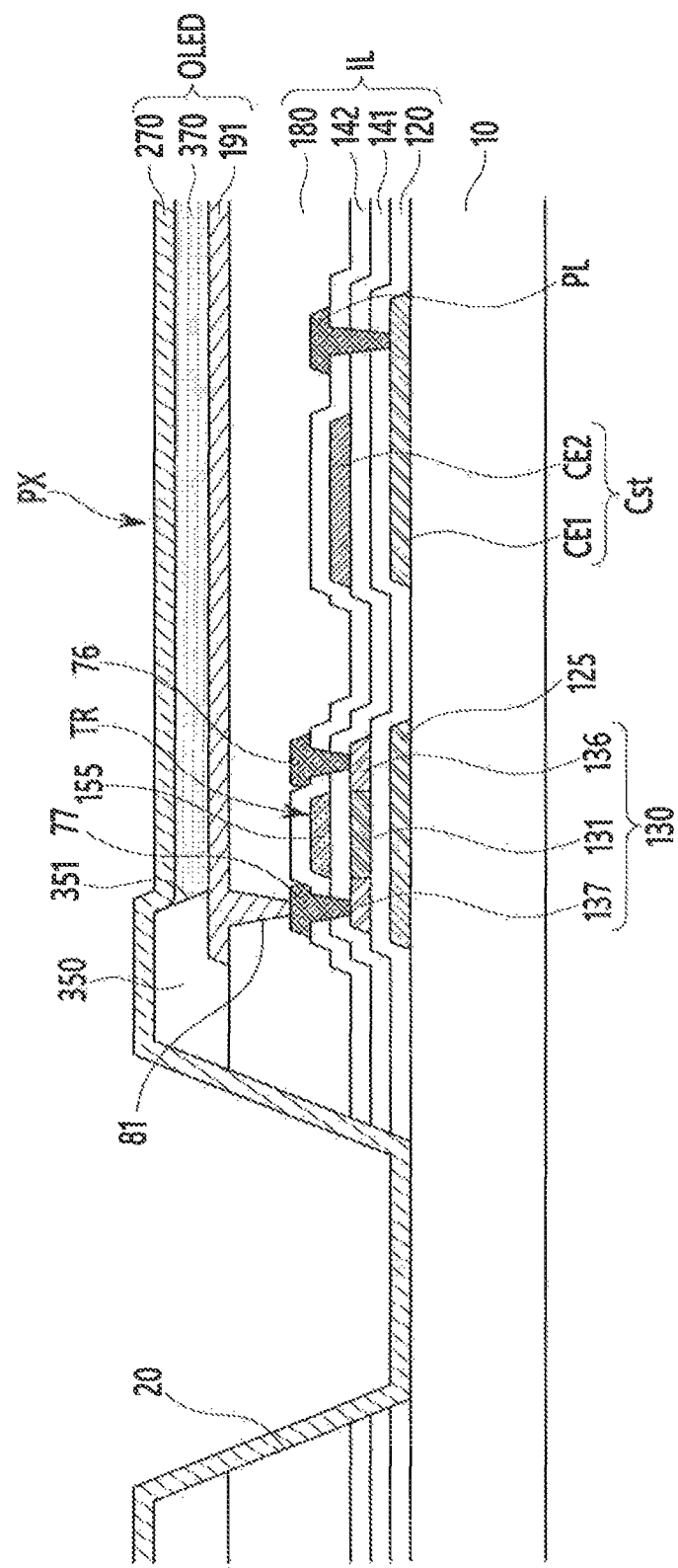
FIG. 10 is a cross-sectional view illustrating an organic light emitting diode according to an exemplary embodiment of the present disclosure.

FIG. 10 is a cross-sectional view illustrating an organic light emitting diode according to an exemplary embodiment of the present invention.

Referring to FIG. 10, the power supply line PL of the organic light emitting diode display is disposed at a same layer as the source electrode 76. The power supply line PL directly contacts the first capacitor electrode CE1 through the insulating layers IL. For example, the power supply line PL directly contacts the first capacitor electrode CE1 through the insulating layers IL without using a connector.

As such, a process of forming a contact hole for a connector may be omitted by allowing the power supply line PL disposed at a same layer as the source electrode 76 to directly contact the first capacitor electrode CE1 disposed at a same layer as the light-blocking electrode 125 through the insulating layers IL without using the connector disposed at a same layer as the gate electrode 155.

As a result, the organic light emitting diode display that is capable of reducing the number of masks used in the manufacturing process is provided.

Hereinafter, an organic light emitting diode display according to an exemplary embodiment of the present invention will be described with reference to FIG. 11. The description will focus on those parts that are different from those of the organic light emitting diode display described with reference to FIG. 2.

Figure 11:
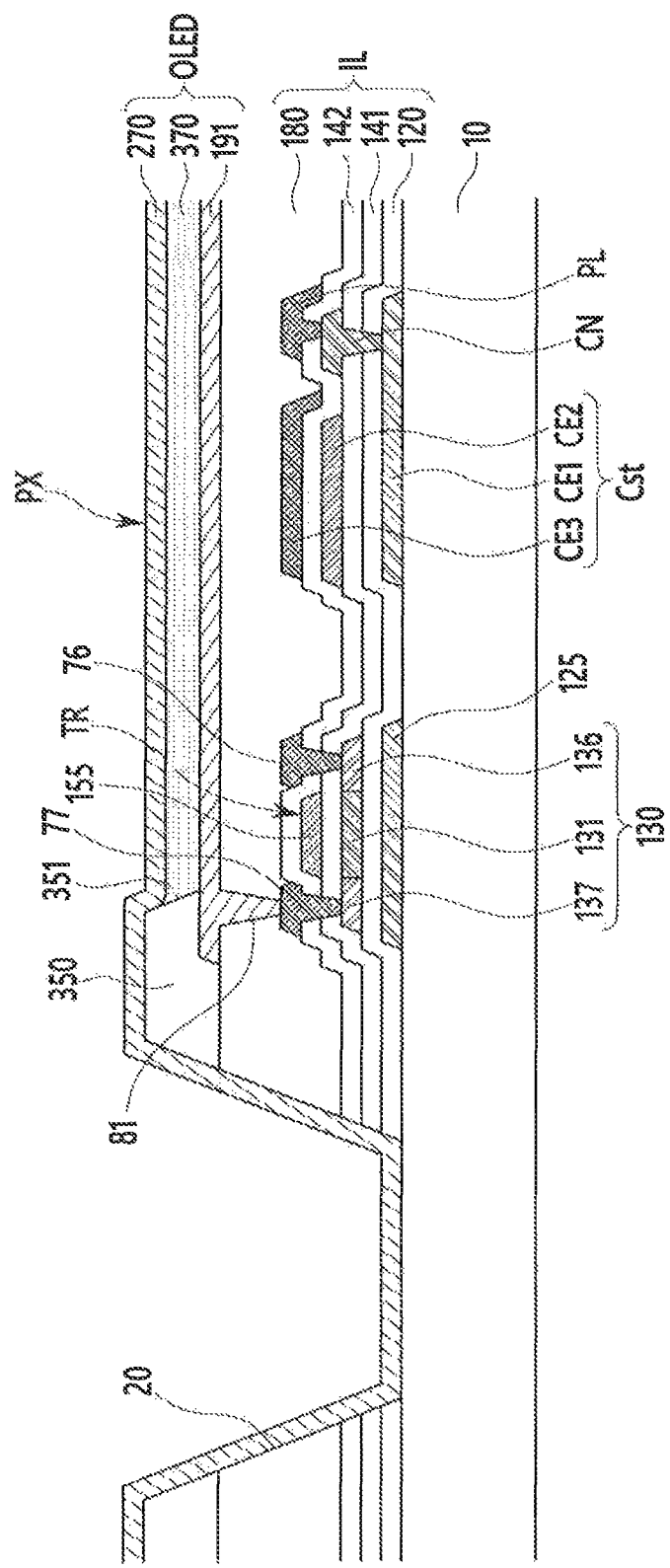
FIG. 11 is a cross-sectional view illustrating an organic light emitting diode according to an exemplary embodiment of the present disclosure.

FIG. 11 is a cross-sectional view illustrating an organic light emitting diode according to an exemplary embodiment of the present invention.

Referring to FIG. 11, each pixel PX of the organic light emitting diode display includes a transistor TR configured to include a plurality of electrode members 125, 130, 155, 76, and 77 disposed at different layers on the substrate 10. A plurality of insulating layers IL is disposed at different layers on the substrate 10 to insulate the electrode members 125, 130, 155, 76, and 77 from each other. A capacitor Cst is connected to the transistor TR. An organic light emitting diode OLED is connected to the transistor TR.

The capacitor Cst includes a first capacitor electrode CE1, a second capacitor electrode CE2, and a third capacitor electrode CE3.

The third capacitor electrode CE3 is overlapped with the second capacitor electrode CE2, and is disposed at a same layer as the source electrode 76, which is another of the electrode members 130, 155, 76, and 77. The third capacitor electrode CE3 may be connected to at least one of the power supply line PL and the first capacitor electrode CE1, but the present exemplary embodiment is not limited thereto.

As such, capacitance of the capacitor Cst is increased by forming the capacitor Cst as a parallel capacitor including the first capacitor electrode CE1, the second capacitor electrode CE2, and the third capacitor electrode CE3.

Hereinafter, an organic light emitting diode display according to an exemplary embodiment of the present invention will be described with reference to FIG. 12. The description will focus on those parts that are different from those of the organic light emitting diode display described with reference to FIG. 2.

Figure 12:
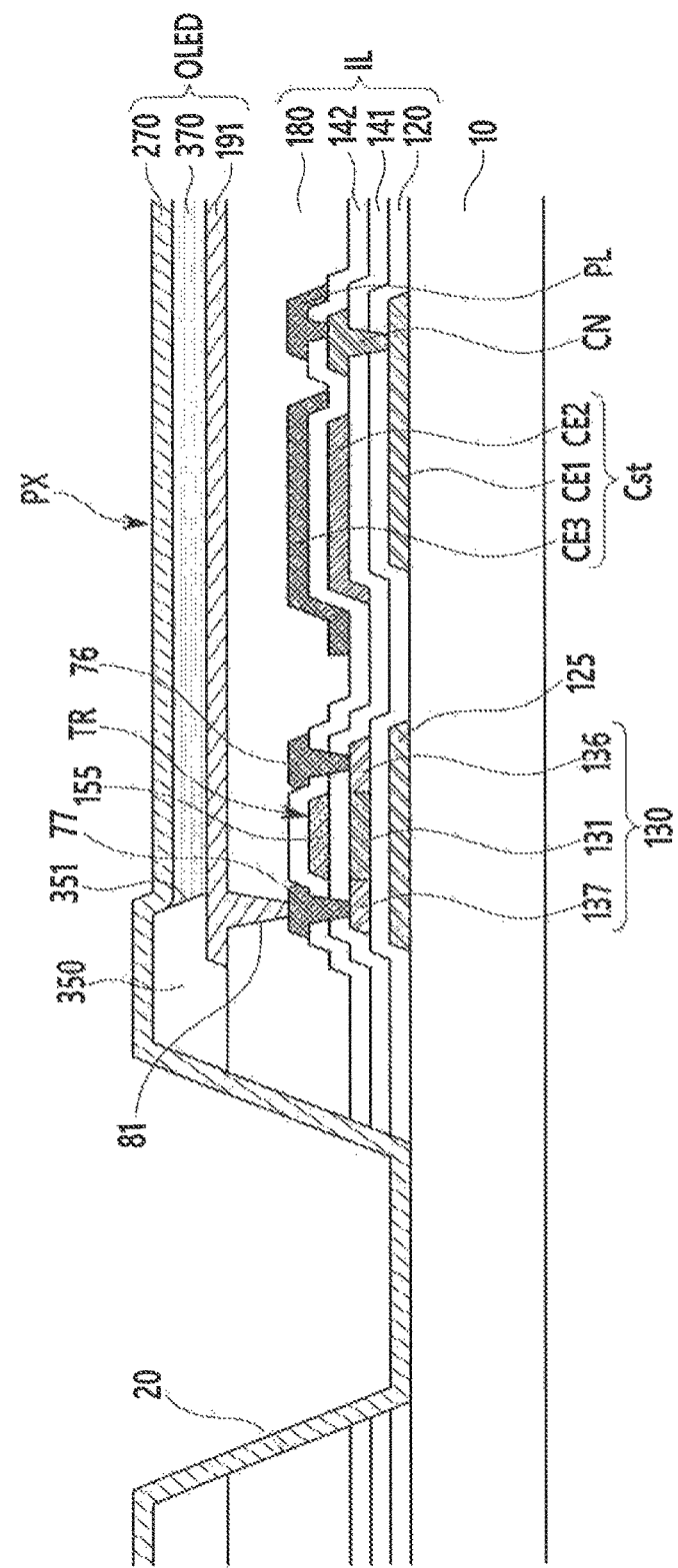
FIG. 12 is a cross-sectional view illustrating an organic light emitting diode according to an exemplary embodiment of the present disclosure.

FIG. 12 is a cross-sectional view illustrating an organic light emitting diode according to an exemplary embodiment of the present invention.

Referring to FIG. 12, each pixel PX of the organic light emitting diode display includes a transistor TR configured to include a plurality of electrode members 125, 130, 155, 76, and 77 disposed at different layers on the substrate 10. A plurality of insulating layers IL is disposed at different layers on the substrate 10 to insulate the electrode members 125, 130, 155, 76, and 77 from each other. A capacitor Cst is connected to the transistor TR, and an organic light emitting diode OLED is connected to the transistor TR.

The capacitor Cst includes a first capacitor electrode CE1, a second capacitor electrode CE2, and a third capacitor electrode CE3.

The third capacitor electrode CE3 is overlapped with the second capacitor electrode CE2, and is disposed at a same layer as the source electrode 76, which is another of the electrode members 130, 155, 76, and 77. The third capacitor electrode CE3 may be connected to at least one of the power supply line PL and the first capacitor electrode CE1, but the present exemplary embodiment is not limited thereto.

An overlapped area between the first capacitor electrode CE1 and the second capacitor electrode CE2 is smaller than an overlapped area between the second capacitor electrode CE2 and the third capacitor electrode CE3.

As such, the capacitor Cst is formed as a parallel capacitor including the first capacitor electrode CE1, the second capacitor electrode CE2, and the third capacitor electrode CE3. Accordingly, even when non-uniform capacitance is stored in one capacitor of the parallel capacitor, it is possible to minimize an effect applied to the second capacitor electrode CE2 connected to the gate electrode 155, since the overlapped area between the first capacitor electrode CE1 and the second capacitor electrode CE2 is smaller than the overlapped area between the second capacitor electrode CE2 and the third capacitor electrode CE3.

Hereinafter, an organic light emitting diode display according to an exemplary embodiment of the present invention will be described with reference to FIG. 13 and FIG. The description will focus on those parts that are different from those of the organic light emitting diode display described with reference to FIGS. 6, 7, and 8.

Figure 13:
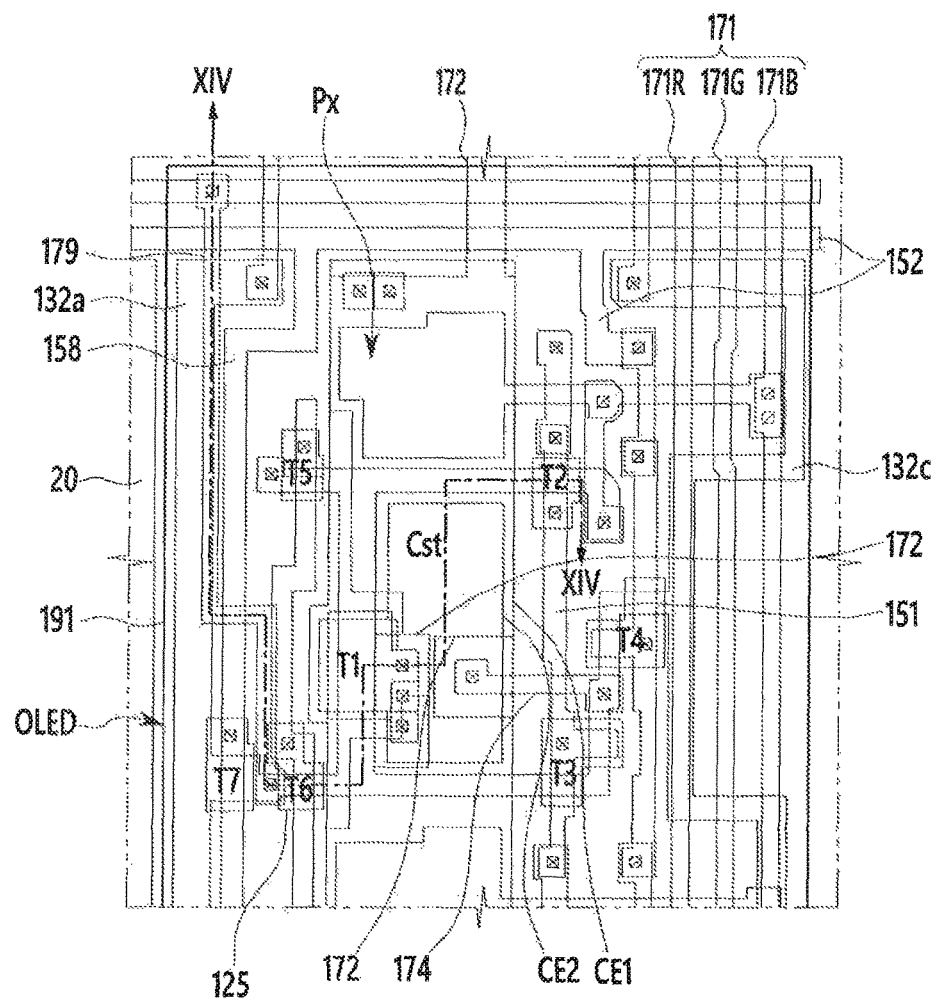
FIG. 13 is a layout view illustrating an organic light emitting diode according to an exemplary embodiment of the present disclosure.
Figure 14:
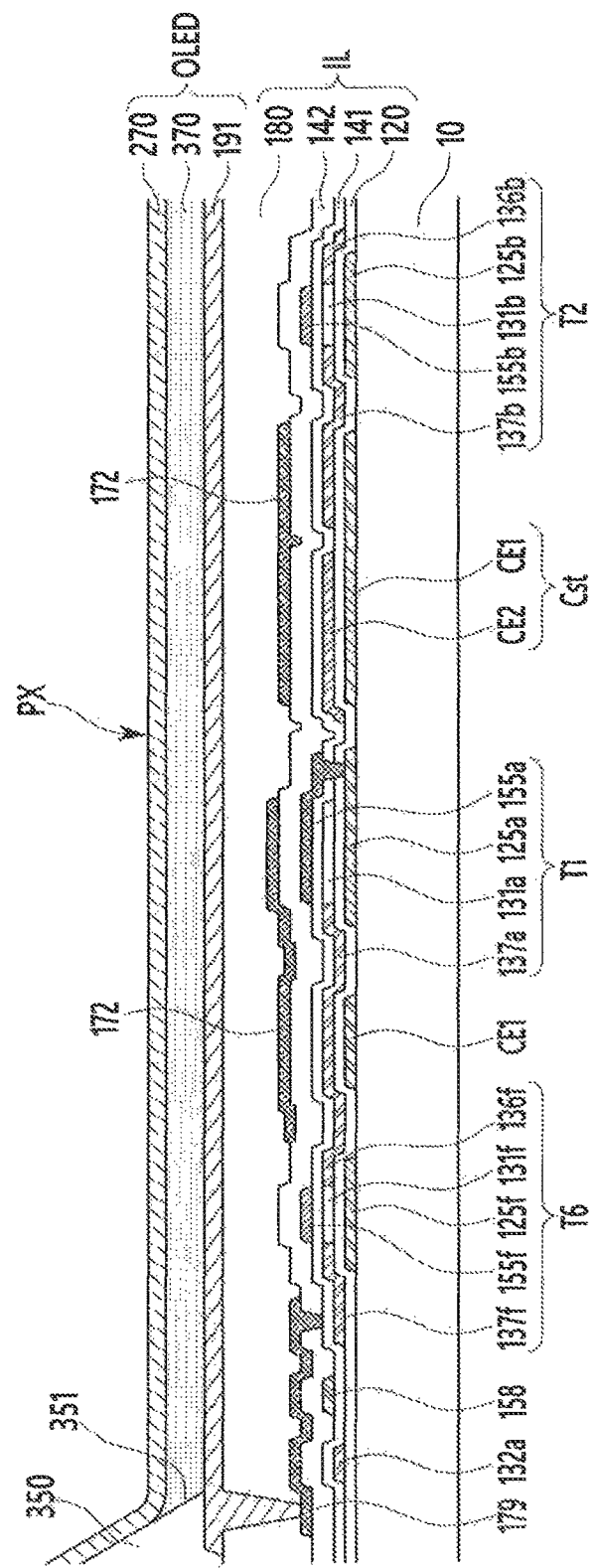
FIG. 14 is a cross-sectional view taken along the line XIV-XIV of FIG. 13.

FIG. 13 is a layout view illustrating an organic light emitting diode according to an exemplary embodiment of the present invention. FIG. 14 is a cross-sectional view taken along the line XIV-XIV of FIG. 13.

Referring to FIG. 13 and FIG. 14, each pixel PX includes a driving transistor T1, a switching transistor T2, a compensation transistor T3, an initialization transistor T4, an operation control transistor T5, a light emission control transistor T6, a bypass transistor T7, a capacitor Cst, a plurality of insulating layers IL, and an organic light emitting diode OLED which are disposed on the substrate 10.

The capacitor Cst includes a first capacitor electrode CE1 and a second capacitor electrode CE2 disposed to interpose the first insulating layer 120 therebetween.

The second capacitor electrode CE2 is connected to the driving gate electrode 155*a*, and is disposed at a same layer as the driving channel 131*a*. The second capacitor electrode CE2 is connected to the driving gate electrode 155*a* through a contact hole, and is overlapped with the first capacitor electrode CE1. The second capacitor electrode CE2 is disposed at a different layer from that of the driving gate electrode 155*a*. The second capacitor electrode CE2 is connected to the driving gate electrode 155*a* through the contact hole. The second capacitor electrode CE2 is connected to the driving connecting member 174. The second capacitor electrode CE2 is connected to the compensation transistor T3 and the initialization transistor T4 through the driving connecting member 174.

The driving connecting member 174 is disposed at a same layer as the data line 171. The driving connecting member 174 is connected to a compensation drain electrode 137*c* of the compensation transistor T3 and an initialization drain electrode 137*d* of the initialization transistor T4 through contact holes. Accordingly, the driving connecting member 174 is connected to the driving gate electrode 155*a* through the second capacitor electrode CE2 to connect the driving gate electrode 155*a* with the compensation drain electrode 137*c* of the compensation transistor T3, and to connect the driving gate electrode 155*a* with the initialization drain electrode 137*d* of the initialization transistor T4.

Accordingly, the capacitor Cst stores storage capacitance corresponding to a difference between the driving voltage ELVDD transferred to the first capacitor electrode CE1 through the driving voltage line 172 and the driving gate voltage Vg of the driving gate electrode 155*a*.

The first insulating layer 120 serves as a dielectric material, and the storage capacitance is determined according to the charge accumulated in the capacitor Cst and a voltage between the first capacitor electrode CE1 and the second capacitor electrode CE2.

As such, a distance between the first capacitor electrode CE1 and the second capacitor electrode CE2 is reduced by disposing the first insulating layer 120 between the first capacitor electrode CE1 and the second capacitor electrode CE2 of the capacitor Cst, thereby increasing capacitance of the capacitor Cst.

Hereinafter, an organic light emitting diode display according to an exemplary embodiment of the present invention will be described with reference to FIG. 15. The description will focus on those parts that are different from those of the organic light emitting diode display described with reference to FIG. 2.

Figure 15:
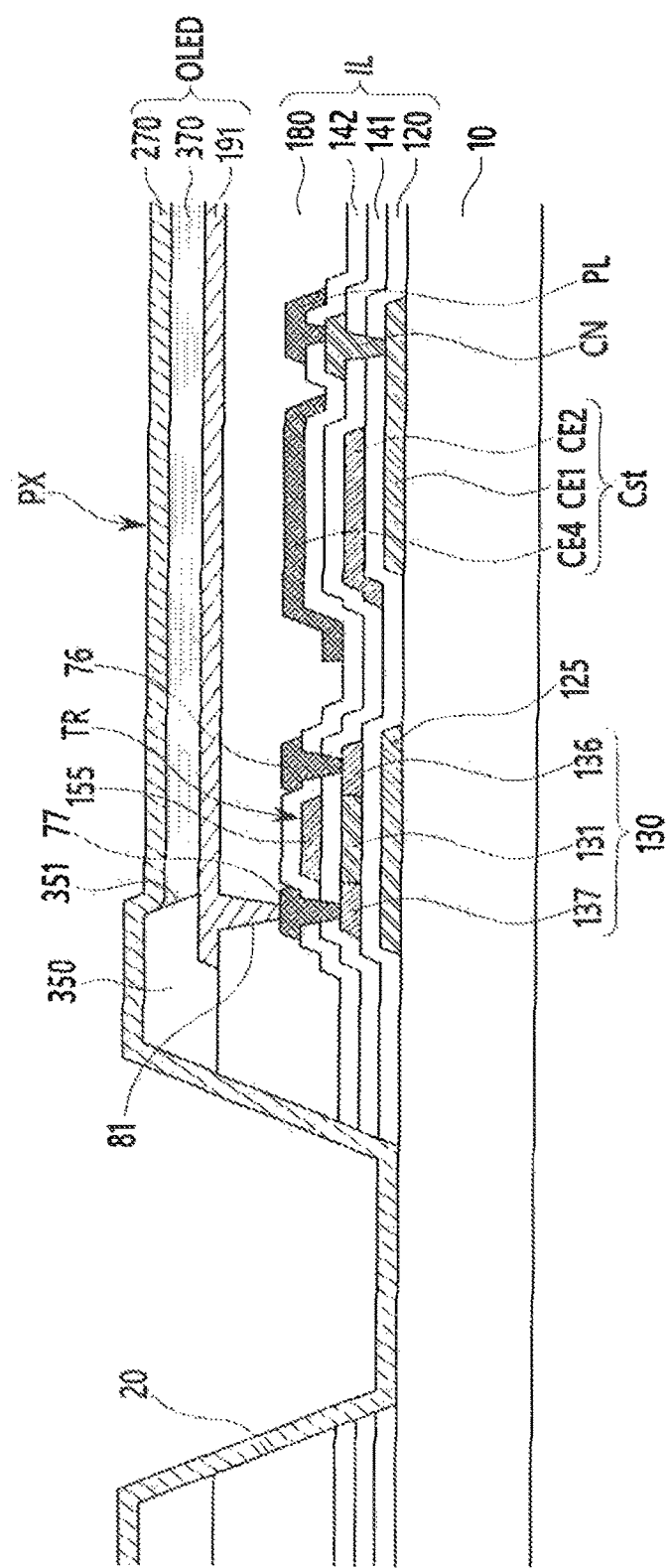
FIG. 15 is a cross-sectional view illustrating an organic light emitting diode according to an exemplary embodiment of the present disclosure.

FIG. 15 is a cross-sectional view illustrating an organic light emitting diode according to an exemplary embodiment of the present invention.

Referring to FIG. 15, each pixel PX of the organic light emitting diode display includes a transistor TR configured to include a plurality of electrode members 125, 130, 155, 76, and 77 disposed at different layers on the substrate 10. A plurality of insulating layers IL is disposed at different layers on the substrate 10 to insulate the electrode members 125, 130, 155, 76, and 77 from each other. A capacitor Cst is connected to the transistor TR. An organic light emitting diode OLED is connected to the transistor TR.

The capacitor Cst includes a first capacitor electrode CE1, a second capacitor electrode CE2, and a fourth capacitor electrode CE4.

The second capacitor electrode CE2 is disposed at a same layer as the semiconductor member 130 among the electrode members 130, 155, 76, and 77. The second capacitor electrode CE2 is connected to the gate electrode 155 of the transistor TR through a contact hole.

A first insulating layer 120 is disposed between the second capacitor electrode CE2 and the first capacitor electrode CE1.

The fourth capacitor electrode CE4 is overlapped with the second capacitor electrode CE2, and is disposed at a same layer as the source electrode 76 which is another one among the electrode members 130, 155, 76, and 77. The fourth capacitor electrode CE4 may be connected to at least one of the power supply line PL and the first capacitor electrode CE1, but the present exemplary embodiment is not limited thereto.

An overlapped area between the first capacitor electrode CE1 and the second capacitor electrode CE2 is smaller than an overlapped area between the second capacitor electrode CE2 and the fourth capacitor electrode CE4.

As such, the capacitor Cst is formed as a parallel capacitor including the first capacitor electrode CE1, the second capacitor electrode CE2, and the fourth capacitor electrode CE4. Accordingly, even when non-uniform capacitance is stored in one capacitor of the parallel capacitor, it is possible to minimize an effect applied to the second capacitor electrode CE2 connected to the gate electrode 155, since the overlapped area between the first capacitor electrode CE1 and the second capacitor electrode CE2 is smaller than the overlapped area between the second capacitor electrode CE2 and the fourth capacitor electrode CE4.

In addition, a distance between the first capacitor electrode CE1 and the second capacitor electrode CE2 is reduced by disposing the first insulating layer 120 between the first capacitor electrode CE1 and the second capacitor electrode CE2 of the capacitor Cst, thereby improving capacitance of the capacitor Cst.

While this disclosure has been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode display comprising:
a substrate;
a plurality of pixels disposed on the substrate; and
a plurality of transmitting windows configured to transmit light therethrough,
wherein the plurality of transmitting windows is spaced apart from the plurality of pixels, and
wherein each of the plurality of pixels includes:
a transistor including a light-blocking electrode disposed on the substrate and a plurality of electrode members disposed at different layers on the light-blocking electrode; and
a capacitor including a first capacitor electrode disposed on a same layer as the light-blocking electrode, and a second capacitor electrode disposed on a same layer as a first one of the plurality of electrode members to overlap the first capacitor electrode,
wherein each the plurality of electrode members includes a semiconductor member disposed to overlap the light-blocking electrode,
the light-blocking electrode is disposed between the semiconductor member and the substrate, and
the light-blocking electrode completely covers the semiconductor member.

2. The organic light emitting diode display of claim 1, wherein each of the plurality of electrode members further includes:
a gate electrode disposed on the semiconductor member; and
a source electrode and a drain electrode disposed to face each other on opposite sides of the gate electrode and connected to the semiconductor member.

3. The organic light emitting diode display of claim 2, wherein the second capacitor electrode is disposed at a same layer as the gate electrode.

4. The organic light emitting diode display of claim 2, wherein the second capacitor electrode is disposed at a same layer as the semiconductor member.

5. The organic light emitting diode display of claim 4, wherein the capacitor further includes a fourth capacitor electrode disposed at a same layer as a second one of the plurality of electrode members, the fourth capacitor electrode overlapping the second capacitor electrode.

6. The organic light emitting diode display of claim 5, wherein the fourth capacitor electrode is disposed at a same layer as the source electrode.

7. The organic light emitting diode display of claim 5, wherein an overlapped area between the first capacitor electrode and the second capacitor electrode is smaller than an overlapped area between the second capacitor electrode and the fourth capacitor electrode.

8. The organic light emitting diode display of claim 2, further comprising
a power supply line connected to the first capacitor electrode,
wherein the second capacitor electrode is connected to the gate electrode.

9. The organic light emitting diode display of claim 8, wherein each of the plurality of pixels further includes a plurality of insulating layers disposed at different layers on the substrate and insulating the light-blocking electrode from each of the plurality of electrode members, and
wherein the power supply line is disposed at a same layer as the source electrode.

10. The organic light emitting diode display of claim 9, wherein the power supply line directly contacts the first capacitor electrode through the plurality of insulating layers.

11. The organic light emitting diode display of claim 9, wherein the power supply line contacts the first capacitor electrode through the insulating layers, and
wherein the power supply line and the first capacitor electrode are connected to each other by a connector disposed at a same layer as the gate electrode.

12. The organic light emitting diode display of claim 3, wherein the capacitor further includes a third capacitor electrode disposed at a same layer as one of the electrode members, the third capacitor electrode overlapping the second capacitor electrode.

13. The organic light emitting diode display of claim 12, wherein the third capacitor electrode is disposed at a same layer as the source electrode.

14. The organic light emitting diode display of claim 12, wherein an overlapped area between the first capacitor electrode and the second capacitor electrode is smaller than an overlapped area between the second capacitor electrode and the third capacitor electrode.

15. The organic light emitting diode display of claim 1, wherein each of the plurality of pixels further includes a plurality of insulating layers disposed at different layers on the substrate, the plurality of insulating layers insulating the light-blocking electrode from each of the plurality of electrode members, and
an insulating layer, of the plurality of insulating layers, contacting the light-blocking electrode, has a thickness that is less than that of another insulating layer of the plurality of insulating layers.

16. The organic light emitting diode display of claim 1, wherein each of the plurality of pixels further includes a buffer layer disposed between the substrate and the light-blocking electrode.

17. The organic light emitting diode display of claim 1, wherein each of the pixels of the plurality of pixels further includes a plurality of insulating layers disposed at different layers on the substrate, the plurality of insulating layers insulating the light-blocking electrode from each of the electrode members, and wherein the transmitting windows include at least one of an opening and a groove formed to overlap at least one of the insulating layers.

18. The organic light emitting diode display of claim 1, further comprising:
a scan line disposed on the substrate and configured to transfer a scan signal;
a data line, crossing the scan line, transferring a data voltage; and
a driving voltage line, crossing the scan line, transferring a driving voltage,
wherein the transistor further includes:
a switching transistor connected to the scan line and the data line; and
a driving transistor connected to the switching transistor and including a driving gate electrode, a driving source electrode, and a driving drain electrode,
wherein the driving gate electrode is connected to the second capacitor electrode, and the driving voltage line is connected to the first capacitor electrode.

19. The organic light emitting diode display of claim 18, wherein the transistor further includes a compensation transistor that is turned on by the scan signal to compensate a threshold voltage of the driving transistor,
wherein the compensation transistor is disposed on a moving path between the driving drain electrode and the driving gate electrode, and
wherein the second capacitor electrode is connected to the compensation transistor.

20. The organic light emitting diode display of claim 18, further comprising:
a previous scan line extended in parallel with the scan line and transferring a previous scan signal; and
an initialization voltage line configured to transfer an initialization voltage for initializing the driving transistor,
wherein the transistor further includes an initialization transistor that is turned on according to the previous scan signal to transfer the initialization voltage to the driving gate electrode, and
wherein the second capacitor electrode is connected to the initialization transistor.

21. A display device, comprising:
a substrate having a pixel area on which a plurality of pixels is disposed and a light transmitting area on which light is permitted to pass therethrough;
a plurality of windows disposed within the light transmitting area of the substrate; and
a thin film transistor disposed within each of the plurality of pixels, the thin film transistor including a light-blocking electrode disposed on the substrate and a plurality of electrode members disposed at different layers on the light-blocking electrode; and
a capacitor including a first capacitor electrode disposed on a same layer as the light-blocking electrode, and a second capacitor electrode disposed on a same layer as a first one of the plurality of electrode members to overlap the first capacitor electrode,
wherein each of the plurality of electrode members includes a semiconductor member disposed to overlap the light-blocking electrode,
the light-blocking electrode is disposed between the semiconductor member and the substrate, and
the light-blocking electrode completely covers the semiconductor member.

22. The display device of claim 21, wherein the plurality of pixels includes sets of colored sub-pixels and each of the plurality of windows is approximately equal in size to each set of colored sub-pixels.

23. The display device of claim 22, wherein each pixel of each set of colored sub-pixels has a different size.

* * * * *